US010429984B2

(12) United States Patent
Matsumoto et al.

(10) Patent No.: US 10,429,984 B2
(45) Date of Patent: Oct. 1, 2019

(54) DISPLAY DEVICE

(71) Applicant: Japan Display Inc., Minato-ku (JP)

(72) Inventors: Yuko Matsumoto, Minato-ku (JP);
Tomohiko Naganuma, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 34 days.

(21) Appl. No.: 15/604,764

(22) Filed: May 25, 2017

(65) Prior Publication Data

US 2017/0351358 A1 Dec. 7, 2017

(30) Foreign Application Priority Data

Jun. 1, 2016 (JP) .................................. 2016-110246

(51) Int. Cl.
*G06F 3/041* (2006.01)
*G06F 3/044* (2006.01)
*H01L 27/32* (2006.01)

(52) U.S. Cl.
CPC .......... *G06F 3/04144* (2019.05); *G06F 3/044* (2013.01); *G06F 3/0412* (2013.01); *G06F 3/0447* (2019.05); *H01L 27/323* (2013.01); *H01L 27/3246* (2013.01);
(Continued)

(58) Field of Classification Search
CPC ......... G06F 3/0412–0418; G06F 3/044; G06F 2203/04102; G06F 2203/04103; G06F 2203/04104; G06F 2203/04106; G06F 2203/04111; G06F 2203/04112; H01L 27/323; H01L 27/3248; H01L 27/3246
See application file for complete search history.

(56) References Cited

U.S. PATENT DOCUMENTS 9,081,450 B1 * 7/2015 Mohindra ............... G06F 3/044
9,836,152 B1 * 12/2017 Yang ..................... G06F 3/0414
(Continued)

FOREIGN PATENT DOCUMENTS

JP 2011-501307 A 1/2011
JP 2014-186711 A 10/2014

OTHER PUBLICATIONS

Jun Wang et al., "A highly sensitive and flexible pressure sensor with electrodes and elastomeric interlayer containing silver nanowires," Nanoscale, vol. 7, 2015, pp. 2926-2932.

*Primary Examiner* — David Tung
(74) *Attorney, Agent, or Firm* — Oblon, McClelland, Maier & Neustadt, L.L.P.

(57) ABSTRACT

A sensing circuit is configured to measure a first physical quantity corresponding to a first capacitance being a parasitic capacitance formed in at least one of electrode groups including a plurality of first electrodes and a plurality of second electrodes, to thereby detect that significant change has occurred in the first capacitance due to touching of a conductor when an obtained first measurement value is out of a first range. The sensing circuit is further configured to measure a second physical quantity corresponding to a second capacitance formed between each of the plurality of first electrodes and each of the plurality of second electrodes, to thereby detect that significant change has occurred in the second capacitance due to compression of an insulating elastic layer based on a pressing force when an obtained second measurement value is out of a second range.

15 Claims, 14 Drawing Sheets

(52) U.S. Cl.
CPC ............ *H01L 27/3248* (2013.01); *G06F 2203/04103* (2013.01); *G06F 2203/04111* (2013.01)

(56) References Cited

U.S. PATENT DOCUMENTS

| | | | |
|---|---|---|---|
| 2010/0134426 A1* | 6/2010 | Lee | G06F 3/0412 345/173 |
| 2010/0315373 A1 | 12/2010 | Steinhauser et al. | |
| 2013/0009905 A1* | 1/2013 | Castillo | G06F 3/044 345/174 |
| 2013/0082970 A1* | 4/2013 | Frey | G06F 3/0414 345/173 |
| 2013/0141382 A1* | 6/2013 | Simmons | G06F 3/0418 345/174 |
| 2014/0204285 A1* | 7/2014 | Jang | G06F 3/044 349/12 |
| 2015/0130742 A1* | 5/2015 | Chen | G06F 3/044 345/174 |
| 2015/0296062 A1* | 10/2015 | Lee | G02F 1/133345 455/566 |
| 2015/0355771 A1* | 12/2015 | Watazu | G06F 3/0414 345/174 |
| 2016/0026315 A1* | 1/2016 | Choi | G06F 3/0414 345/174 |
| 2016/0231849 A1* | 8/2016 | Watazu | G06F 3/044 |
| 2017/0075493 A1* | 3/2017 | Lee | G06F 3/0418 |

\* cited by examiner

DISPLAY DEVICE

CROSS-REFERENCE TO RELATED APPLICATION

The present application claims priority from Japanese application JP 2016-110246 filed on Jun. 1, 2016, the content of which is hereby incorporated by reference into this application.

BACKGROUND OF THE INVENTION

1. Field of the Invention

The present invention relates to a display device.

2. Description of the Related Art

Touch panels of mobile displays such as smart phones widely employ a capacitive system. Hitherto, touch panels have often been formed separately from displays, but, recently, touch panels tend to be built into displays in view of reduction in thickness and cost and advantage in optical characteristics.

As a system for sensing, there is known a technology of mounting a pressure-sensitive sensor configured to detect not only a position, but also pressing when the display is pressed with a finger (Japanese Patent Translation Publication No. 2011-501307). The pressure-sensitive sensor is non-transparent, and hence the pressure-sensitive sensor has been provided on the back side of the display or in a peripheral region (frame) of a display region separately from a sensor for detecting a touch position so as not to hinder light emission. In Japanese Patent Application Laid-open No. 2014-186711, there is disclosed a technology of arranging a piezoelectric sensor so as to overlap a display surface of the display device, but different electrodes have been necessary for position detection and for pressing detection. In this case, separately from the display device, at least one type of touch sensor is necessary, and those components are required to be bonded to each other. Thus, there have been problems in thickness and cost.

SUMMARY OF THE INVENTION

The present invention has an object to provide a display device including a built-in touch sensor capable of detecting a touch position and pressing.

A display device according to one embodiment of the present invention includes: a light emitting element layer having a structure in which a light emitting layer is sandwiched between a cathode and an anode; an inorganic insulating layer covering the light emitting element layer; a plurality of first electrodes laminated on the inorganic insulating layer, the plurality of first electrodes extending in a first direction and being adjacent to each other in a second direction intersecting with the first direction; a plurality of second electrodes extending in the second direction and being adjacent to each other in the first direction above the plurality of first electrodes; an insulating elastic layer interposed between the plurality of first electrodes and the plurality of second electrodes in order to secure an interval between the plurality of first electrodes and the plurality of second electrodes; and a sensing circuit, the sensing circuit being configured to measure a first physical quantity corresponding to a first capacitance being a parasitic capacitance formed in each of electrode groups including the plurality of first electrodes and the plurality of second electrodes, to thereby detect that significant change has occurred in the first capacitance due to touching of a conductor when an obtained first measurement value is out of a first range, the sensing circuit being further configured to measure a second physical quantity corresponding to a second capacitance formed between each of the plurality of first electrodes and each of the plurality of second electrodes, to thereby detect that significant change has occurred in the second capacitance due to compression of the insulating elastic layer based on a pressing force when an obtained second measurement value is out of a second range. According to the present invention, the first electrodes and the second electrodes are shared for detection of the touch position and detection of the pressing. Further, a sensor having both the functions is arranged on the touching side (light emitting direction) of the display device. Therefore, the display device is excellent in thickness, cost, touch sensitivity, and optical characteristics. Further, a sensor is not required to be provided in a peripheral region of the display device, and hence a frame can be narrowed.

DETAILED DESCRIPTION OF THE INVENTION

Figure 1:
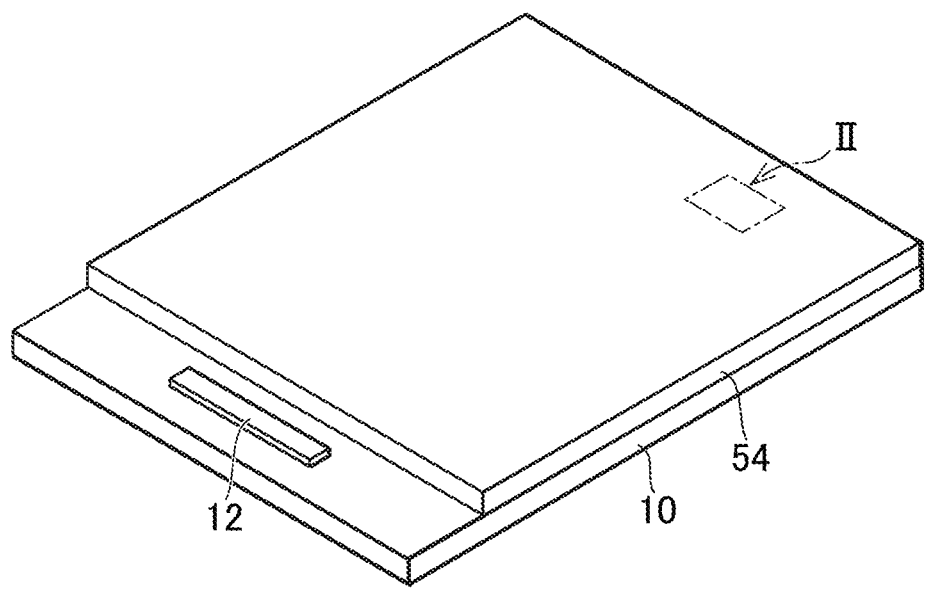
FIG. 1 is a perspective view for illustrating a display device according to a first embodiment of the present invention.

Now, embodiments of the present invention are described with reference to the drawings. The present invention can be implemented by various modes without departing from the gist of the present invention, and is not to be construed as being limited to the contents of exemplary embodiments described below.

For clearer illustration, some widths, thicknesses, shapes, and the like of respective portions are schematically illustrated in the drawings in comparison to actual ones. However, the widths, the thicknesses, the shapes, and the like are merely an example, and do not limit understanding of the present invention. Further, elements having functions similar to those described relating to the drawings already referred to are denoted by like reference symbols herein and in each of the drawings, and detailed description thereof is sometimes omitted.

Further, in the detailed description of the present invention, when a positional relationship between a certain structure and another structure is defined, unless particularly noted, "on." and "under" are used not only when the another structure is positioned immediately above or immediately below the certain structure, but also when further another structure is interposed between the structures.

First Embodiment

FIG. 1 is a perspective view for illustrating a display device according to a first embodiment of the present invention. An organic electroluminescent display device is given as an example of the display device. The display device is configured to form full-color pixels by combining unit pixels (sub-pixels) of a plurality of colors of, for example, red, green, and blue, to thereby display a full-color image. The display device includes a first substrate 10. The first substrate 10 includes an integrated circuit chip 12 that is mounted for driving elements for displaying an image. A flexible printed board (not shown) may be connected to the first substrate 10 for electrical connection to the outside.

Figure 2:
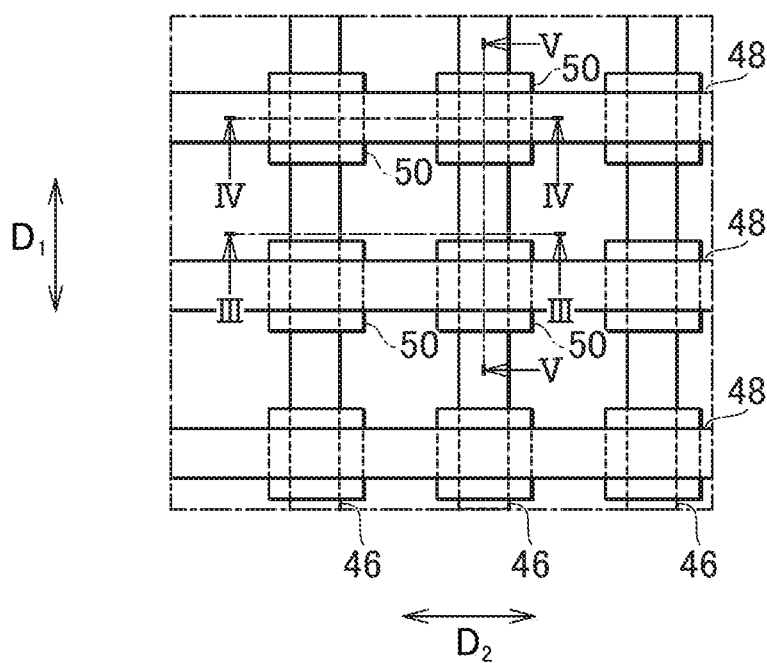
FIG. 2 is an enlarged view for illustrating a part indicated by the arrow II of FIG. 1.
Figure 3:
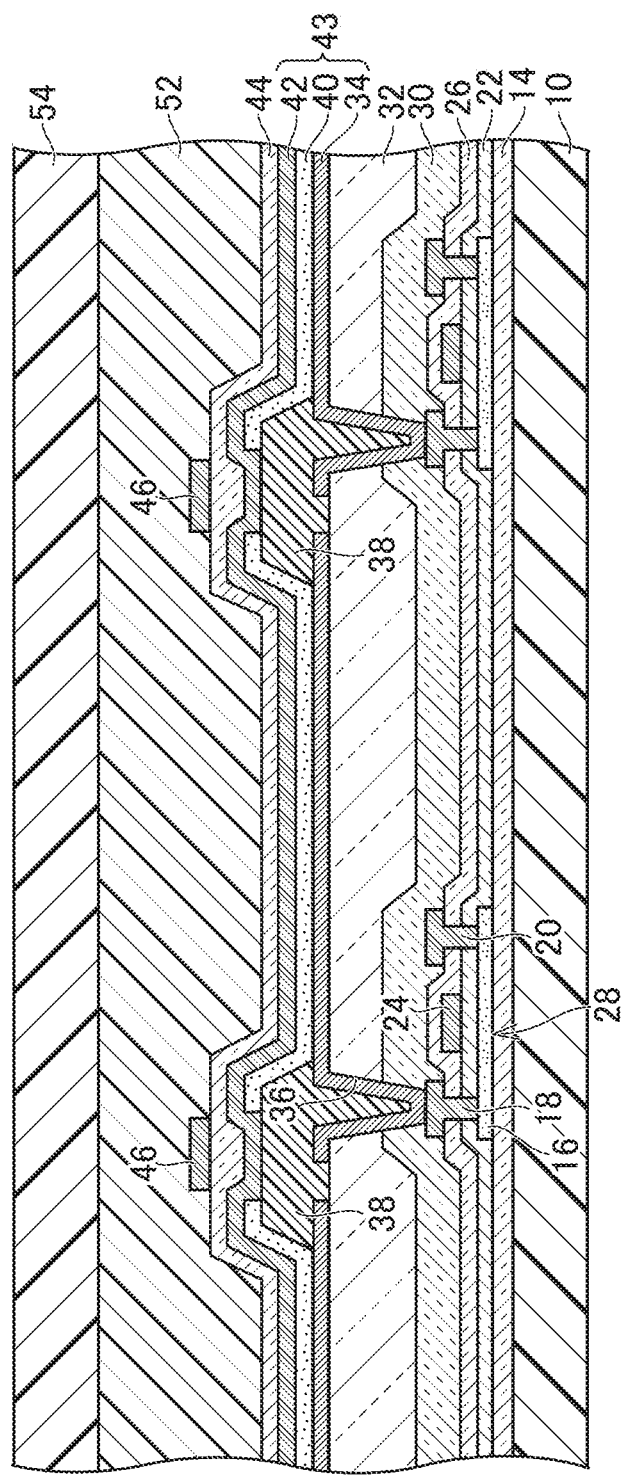
FIG. 3 is an enlarged view of a cross section taken along the line of the display device illustrated in FIG. 2.

FIG. 2 is an enlarged view for illustrating a part indicated by the arrow II of FIG. 1. FIG. 3 is an enlarged view of a cross section taken along the line of the display device illustrated in FIG. 2. The first substrate 10 is made of a resin or glass. A flexible film made of, for example, polyimide or polyethylene terephthalate may also be used for the first substrate 10. On the first substrate 10, an undercoat layer 14 is formed so as to serve as a barrier against impurities included in the first substrate 10 itself. The undercoat layer 14 includes, for example, a silicon oxide film or a silicon nitride film, or may have a laminate structure of those films. A semiconductor layer 16 is formed on the undercoat layer 14. A source electrode 18 and a drain electrode 20 are electrically connected to the semiconductor layer 16, and a gate insulating film 22 is formed so as to cover the semiconductor layer 16. A gate electrode 24 is formed on the gate insulating film 22, and an interlayer insulating film 26 is formed so as to cover the gate electrode 24. The source electrode 18 and the drain electrode 20 pass through the gate insulating film 22 and the interlayer insulating film 26. The semiconductor layer 16, the source electrode 18, the drain electrode 20, and the gate electrode 24 form a thin film transistor 28. A passivation film 30 is formed so as to cover the thin film transistor 28.

A planarizing layer 32 is formed on the passivation film 30. On the planarizing layer 32, a plurality of anodes 34 (for example, pixel electrodes) are formed so as to correspond to the plurality of unit pixels (sub-pixels). The planarizing layer 32 is formed so that at least a surface on which the anodes 34 are formed is planarized. The planarizing layer 32 is often made of an organic material, for example, a photosensitive acrylic resin. Each of the anodes 34 is electrically connected to one of the source electrode 18 and the drain electrode 20 formed on the semiconductor layer 16, through a contact hole 36 passing through the planarizing layer 32 and the passivation film 30.

An insulating layer 38 is formed on the planarizing layer 32 and the anode 34. The insulating layer 38 is formed so as to climb over a peripheral edge portion of the anode 34 so that a part (for example, a center portion) of the anode 34 is exposed. The insulating layer 38 is used to form a bank surrounding a part of the anode 34.

Light emitting layers 40 are formed on the anodes 34. The light emitting layers 40 are formed separately (in isolation) for the respective anodes 34, and are also formed so as to climb over the insulating layer 38. In this case, the light emitting layers 40 emit light of blue, red, and green so as to correspond to the respective pixels. The colors corresponding to the respective pixels are not limited to the above-mentioned colors, and may be, for example, yellow or white. Those layers are formed by, for example, vapor deposition. Further, those layers may be formed across the entire surface covering the display region, or over a plurality of pixels. That is, in FIG. 3, the light emitting layers 40 are continuously formed on the insulating layer 38. In this case, the light emitting layers 40 are formed by coating using solvent dispersion. In the case of solid formation, white light may be obtained in all of the sub-pixels, and color filters may be formed on a second substrate 54, to thereby extract desired color wavelength parts.

On the light emitting layers 40, a cathode 42 (for example, a common electrode) is formed. The cathode 42 is formed so as to climb onto the insulating layer 38 serving as the bank. A light emitting element layer 43 including the light emitting layers 40, and the anodes 34 and the cathode 42, which sandwich the light emitting layers 40, is formed. Each of the light emitting layers 40 is sandwiched between the anode 34 and the cathode 42, and is configured to emit light with a brightness controlled by a current flowing between the anode 34 and the cathode 42. At least one of a hole transport layer (not shown) or a hole injection layer (not shown) may be formed between the light emitting layer 40 and the anode 34. At least one of an electron transport layer (not shown) or an electron injection layer (not shown) may be formed between the light emitting layer 40 and the cathode 42. The light emitting element layer 43 is covered with a sealing layer 44 laminated on the cathode 42, to thereby be sealed and blocked from moisture. The sealing layer 44 may include an inorganic film of SiN or other materials, and may have a laminate structure. For example, the sealing layer 44 may be structured to have an organic film made of a resin or other materials, which is sandwiched between a pair of inorganic layers. In FIG. 3, the sealing layer 44 has a step that protrudes to a pressure-sensitive adhesive layer 52 side, but when the sealing layer 44 has a sufficient thickness, the sealing layer 44 may be flat on the side of the pressure-sensitive adhesive layer 52.

A plurality of first electrodes 46 are formed on the sealing layer 44. As illustrated in FIG. 2, the plurality of first electrodes 46 extend in a first direction $D_1$ and are adjacent to each other in a second direction $D_2$ intersecting with (for example, orthogonal to) the first direction $D_1$. Further, above the plurality of first electrodes 46, a plurality of second electrodes 48 extend in the second direction $D_2$ and are adjacent to each other in the first direction $D_1$.

Figure 4:
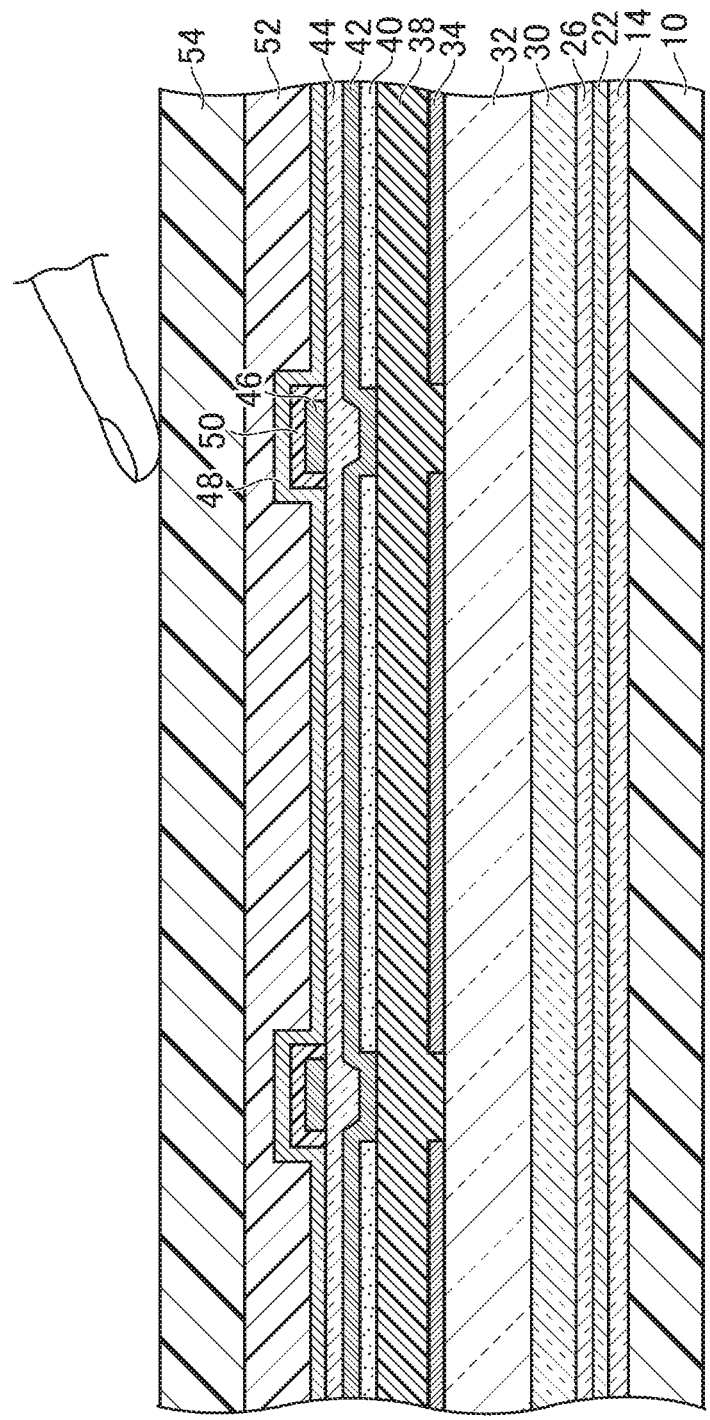
FIG. 4 is an enlarged view of a cross section taken along the line IV-IV of the display device illustrated in FIG. 2.
Figure 5:
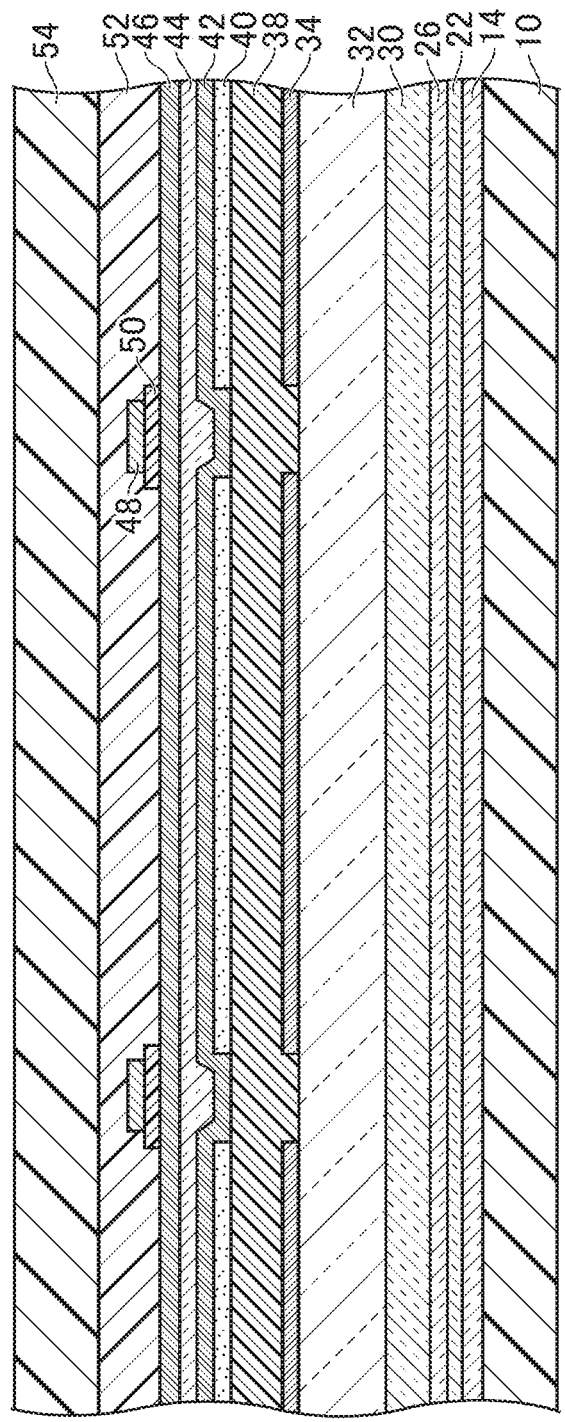
FIG. 5 is an enlarged view of a cross section taken along the line V-V of the display device illustrated in FIG. 2.

FIG. 4 and FIG. 5 are an enlarged view of a cross section taken along the line IV-IV and an enlarged view of a cross section taken along the line V-V, respectively, of the display device illustrated in FIG. 2. Insulating elastic layers 50 are interposed between the plurality of first electrodes 46 and the plurality of second electrodes 48 so as to secure an interval between the plurality of first electrodes 46 and the plurality of second electrodes 48. The insulating elastic layers 50 are made of a dielectric material. Polyurethane or cellulose acetate may be given as the material of the insulating elastic layers 50. Those materials can form a layer with use of water or a highly volatile solvent (for example, ethanol or acetone), and hence the layer can be formed under low temperature (about 100° C. or less) at which the light emitting layers 40 are not damaged. The first electrodes 46 and the second electrodes 48 may be made of a light-transmissive conductive oxide, for example, indium tin oxide (ITO) or indium zinc oxide (IZO), or a metal having high reflectance, for example, aluminum or silver. Those materials are used as appropriate depending on the extraction direction of the emitted light. When a sufficient distance is secured between the light emitting element layer 43 and each of the first electrodes and the second electrodes, no problem arises in the positional relationship between a region in which the light emitting element layer 43 emits light and each of the first electrodes and the second electrodes. Meanwhile, when the distance between the light emitting element layer 43 and each of the first electrodes and the second electrodes is small, for example, as illustrated in FIG. 3, both of the first and second electrodes may be formed on the insulating layer 38, to thereby increase the light emitting efficiency without hindering the light emission from the light emitting element layer 43.

The insulating elastic layers 50 are spread at a plurality of positions as illustrated in FIG. 2 so as to facilitate elastic deformation. The insulating elastic layers 50 are located at positions at which the insulating elastic layers 50 and both groups of the plurality of first electrodes 46 and the plurality of second electrodes 48 overlap each other. The insulating elastic layers 50 may be formed at positions at which the insulating elastic layers 50 and only one group of the plurality of first electrodes 46 and the plurality of second electrodes 48 overlap each other, or may be further formed at positions at which the insulating elastic layers 50 and both groups of the plurality of first electrodes 46 and the plurality of second electrodes 48 do not overlap each other. The insulating elastic layers 50 are formed so as to avoid at least a part of positions at which the insulating elastic layers 50 and at least one group (in the example of FIG. 2, both groups) of the plurality of first electrodes 46 and the plurality of second electrodes 48 do not overlap each other. That is, there are regions in which the insulating elastic layer 50 is not formed at positions at which the insulating elastic layers 50 and both groups of the plurality of first electrodes 46 and the plurality of second electrodes 48 do not overlap each other. The insulating elastic layers 50 may be formed by applying a photolithography method, a transfer printing method, or an inkjet method. In the case of such formation methods, local formation of the insulating elastic layers prevents dispersion of the force applied during pressing, and enables the sensor sensitivity to be increased.

The second substrate 54 is bonded to the sealing layer 44 through intermediation of the pressure-sensitive adhesive layer 52. The second substrate 54 is made of a resin or glass. The second substrate 54 may be a flexible film as in the case of the first substrate 10. The pressure-sensitive adhesive layer 52 is formed on the plurality of first electrodes 46, the plurality of second electrodes 48, and the insulating elastic layers 50. The display device according to the first embodiment includes a built-in touch panel. That is, as illustrated in FIG. 4, the display device can detect touching based on approach of a conductor, for example, a finger. The first embodiment employs the principle of a mutual capacitance system.

Figure 6:
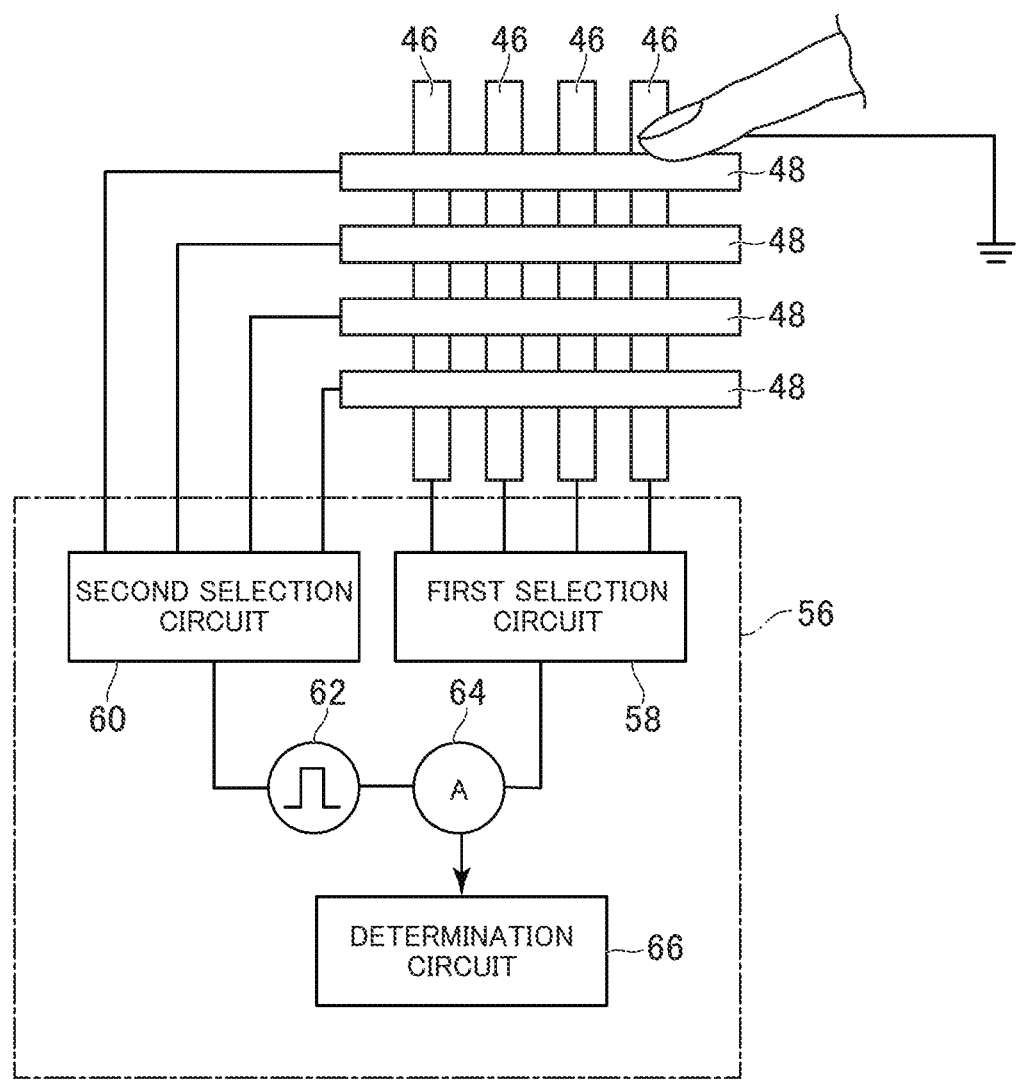
FIG. 6 is a diagram for illustrating a circuit for achieving touch sensing of the display device according to the first embodiment.

FIG. 6 is a diagram for illustrating a circuit for achieving touch sensing of the display device according to the first embodiment. The display device includes a sensing circuit 56. For example, the sensing circuit 56 is built into the integrated circuit chip 12 illustrated in FIG. 1. The sensing circuit 56 includes a first selection circuit 58. The first selection circuit 58 is configured to select one of the plurality of first electrodes 46. The sensing circuit 56 includes a second selection circuit 60. The second selection circuit 60 is configured to select one of the plurality of second electrodes 48. The sensing circuit 56 includes a pulse generator 62. A pulse voltage output from the pulse generator 62 is applied to one of the selected one first electrode 46 and the selected one second electrode 48 (in this example, the second electrode 48 on the upper side).

A first capacitance is a parasitic capacitance formed in each of electrode groups including the plurality of first electrodes 46 and the plurality of second electrodes 48. For example, the first capacitance is formed between the selected one first electrode 46 and the selected one second electrode 48. As illustrated in FIG. 6, when touching of a conductor, for example, a finger, occurs, an electrical field between the first electrode 46 and the second electrode 48 is decreased, and hence the first capacitance is decreased. The electrode other than the electrode to which the pulse voltage is applied (in this example, the first electrode 46 on the lower side) is connected to an ammeter 64. The ammeter 64 is configured to measure a first physical quantity (current value) corresponding to the first capacitance. The first physical quantity corresponds to a capacitance between each of the plurality of first electrodes 46 and each of the plurality of second electrodes 48.

Figure 7:
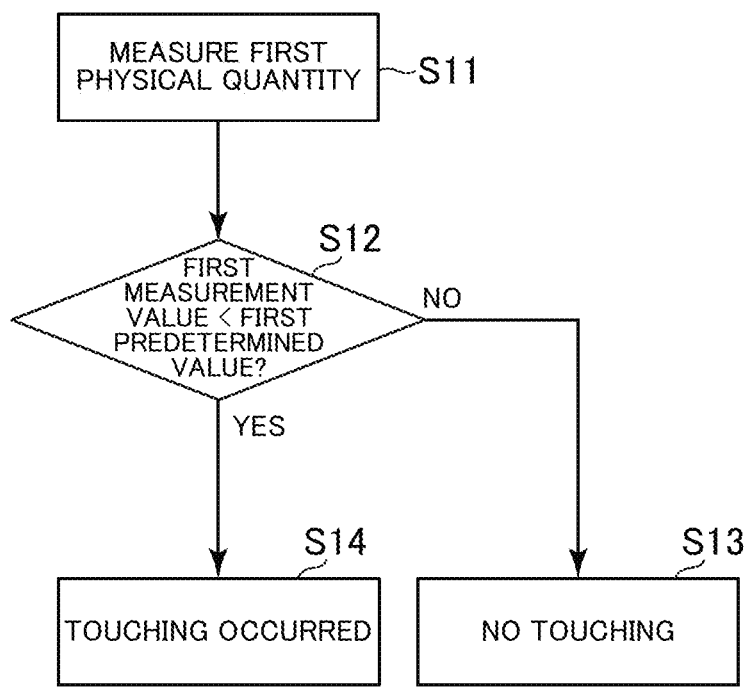
FIG. 7 is a chart for illustrating the flow of the touch sensing of the display device according to the first embodiment.

FIG. 7 is a chart for illustrating the flow of the touch sensing of the display device according to the first embodiment. The first physical quantity (current value) is measured with the ammeter 64 illustrated in FIG. 6 (S11), and a first measurement value obtained through the measurement is input to a determination circuit 66. The determination circuit 66 determines whether or not the first measurement value is out of a first range. The first range is a range obtained by considering a design value when no touching of a conductor, for example, a finger, occurs, and an error of the design value. No touching is determined when the first measurement value is within the first range. When the first measurement value is out of the first range, it is detected that significant change has occurred in the first capacitance due to approach of a conductor, for example, a finger (that is, touching has occurred).

The first embodiment employs the mutual capacitance system in which the first measurement value decreases when touching occurs. Therefore, as determination on whether or not the first measurement value is out of the first range, the determination circuit 66 determines whether or not the first measurement value is smaller than a first predetermined value (S12). When the result of the determination is NO, it is detected that no touching has occurred (S13). When the result of the determination is YES, it is detected that touching has occurred (S14).

The display device of the first embodiment further detects that the screen has been pressed. The first electrodes 46 and the second electrodes 48, which are used for detection of the touch position, are shared for detection of pressing as described below, and hence remarkable effects are produced in thickness, cost, and optical characteristics.

Figure 8:
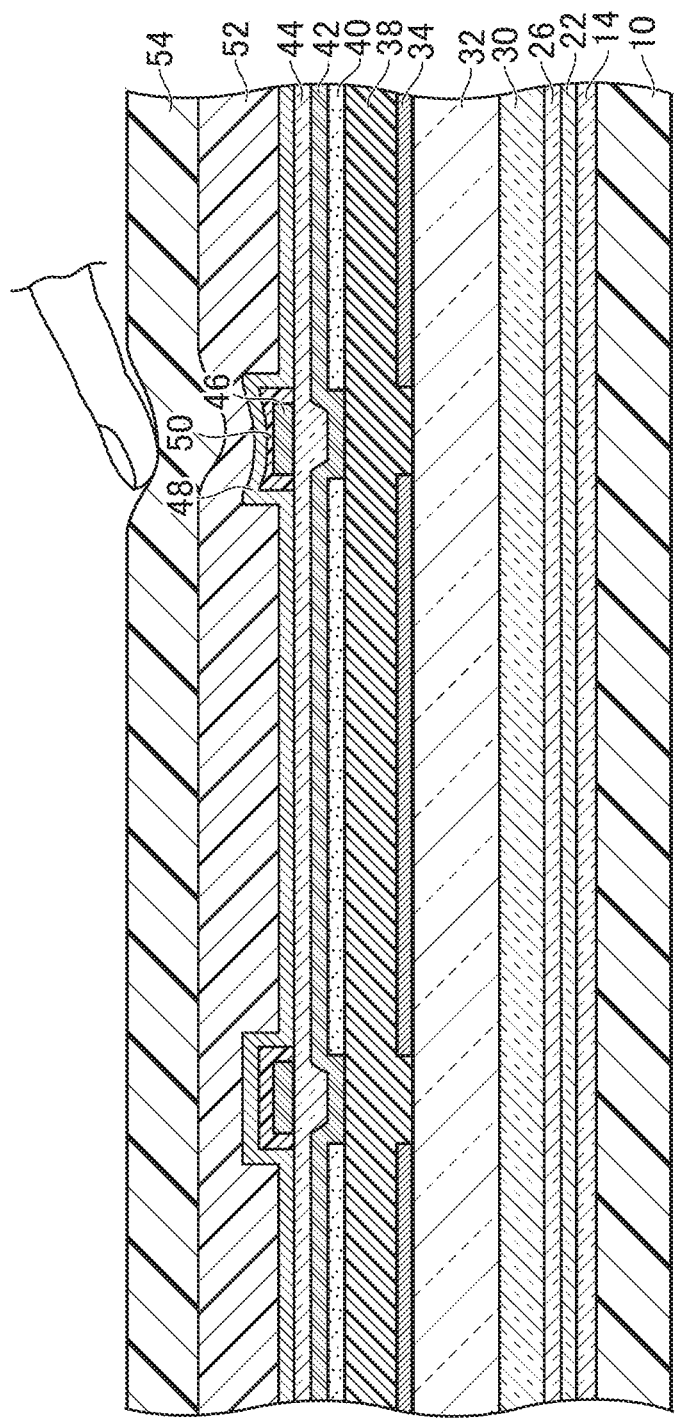
FIG. 8 is a view for illustrating a state in which a screen is pressed with a finger.

FIG. 8 is a view for illustrating a state in which the screen is pressed with a finger. When the screen is pressed, through intermediation of the second substrate 54 and the pressure-sensitive adhesive layer 52, the second electrode 48 is bent to compress the insulating elastic layer 50. With this, the interval between the first electrode 46 and the second electrode 48 is decreased, and hence a second capacitance between the two electrodes is increased.

Figure 9:
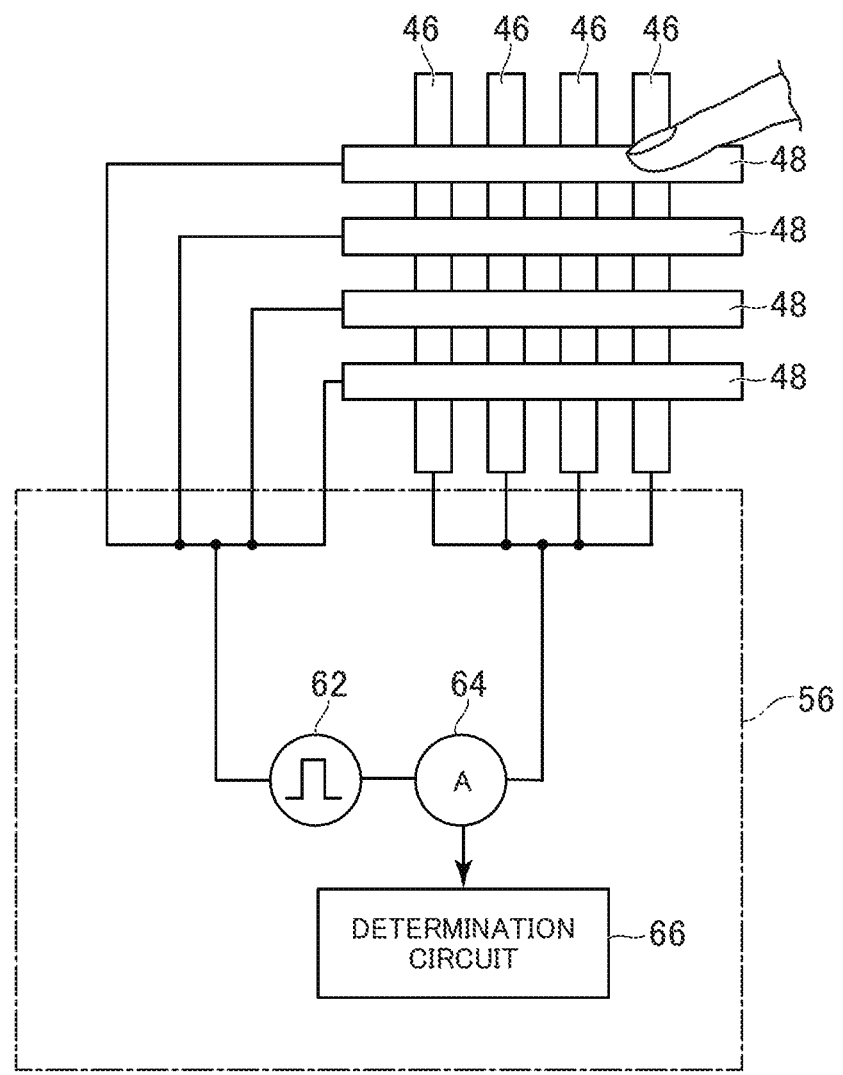
FIG. 9 is a diagram for illustrating a circuit for achieving pressing sensing of the display device according to the first embodiment.

FIG. 9 is a diagram for illustrating a circuit for achieving pressing sensing of the display device according to the first embodiment. The sensing circuit 56 is configured to measure a second physical quantity corresponding to a second capacitance between each of the plurality of first electrodes 46 and each of the plurality of second electrodes 48. When only whether or not pressing has occurred is detected (position of the pressing is not detected), the second physical quantity corresponding to a sum of the plurality of second capacitances may be detected. For example, the plurality of first electrodes 46 are connected to each other, the plurality of second electrodes 48 are connected to each other, and the second physical quantity (current value) is measured with the ammeter 64 based on the pulse value applied from the pulse generator 62. The first selection circuit 58 (see FIG. 6) may be used to connect the plurality of first electrodes 46 to each other, and the second selection circuit 60 (see FIG. 6) may be used to connect the plurality of second electrodes 48 to each other. When pressing of a finger or the like occurs, the second capacitance is increased.

Figure 10:
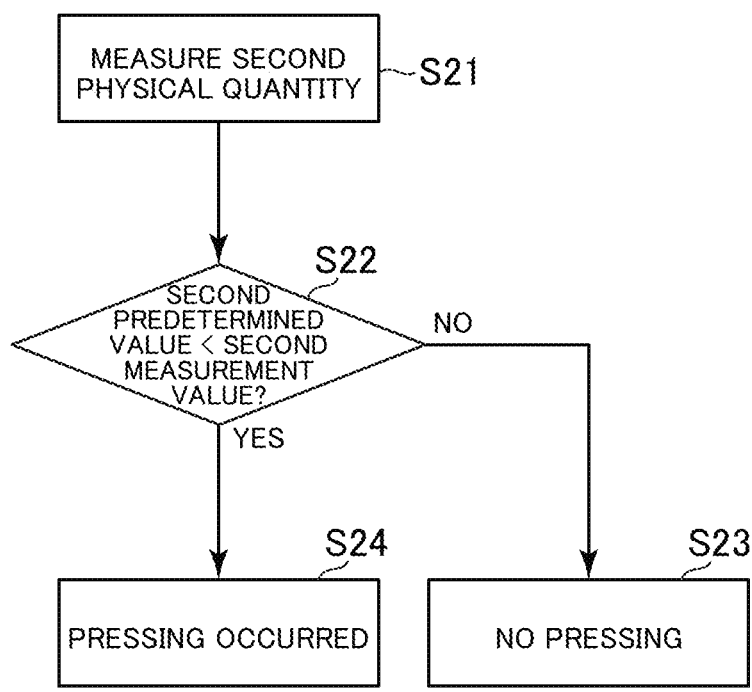
FIG. 10 is a chart for illustrating the flow of the pressing sensing of the display device according to the first embodiment.

FIG. 10 is a chart for illustrating the flow of the pressing sensing of the display device according to the first embodiment. The second physical quantity (current value) is measured with the ammeter 64 (S21), and a second measurement value obtained through the measurement is input to the determination circuit 66 (see FIG. 9). The determination circuit 66 determines whether or not the second measurement value is out of a second range. The second range is a range obtained by considering a design value when no pressing by a finger or the like, occurs, and an error of the design value. No pressing is determined when the second measurement value is within the second range. When the second measurement value is out of the second range, it is detected that significant change has occurred in the second capacitance due to compression of the insulating elastic layer 50 based on the pressing (that is, pressing has occurred).

When the insulating elastic layer 50 is compressed, the interval between the first electrode 46 and the second electrode 48 is decreased to increase the second measurement value. Therefore, as determination on whether or not the second measurement value is out of the second range, the determination circuit 66 determines whether or not the second measurement value is larger than a second predetermined value (S22). When the result of the determination is NO, it is detected that no pressing has occurred (S23). When the result of the determination is YES, it is detected that pressing has occurred (S24).

Second Embodiment

Figure 11:
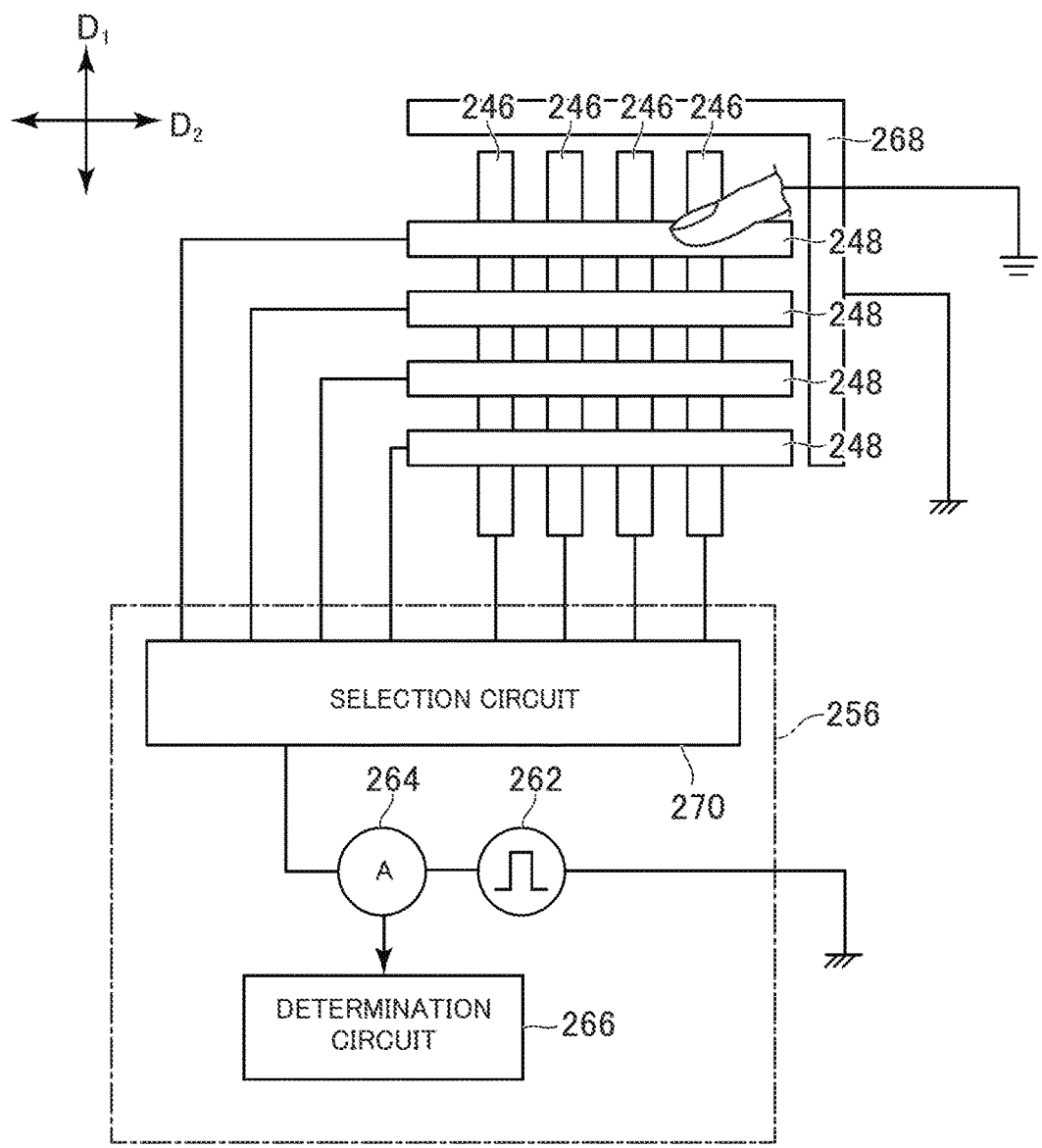
FIG. 11 is a diagram for illustrating a circuit for achieving touch sensing of a display device according to a second embodiment of the present invention.

FIG. 11 is a diagram for illustrating a circuit for achieving touch sensing of a display device according to a second embodiment of the present invention. The second embodiment employs the principle of a self-capacitance system. That is, the touch sensing is achieved based on a capacitance between a first electrode 246 or a second electrode 248 and a reference potential (for example, GND) of a metal frame 268 or other components.

A sensing circuit 256 includes a selection circuit 270. The selection circuit 270 is configured to select one of electrode groups including a plurality of first electrodes 246 and a plurality of second electrodes 248. The plurality of first electrodes 246 are adjacent to each other in the second direction $D_2$, and hence are used for detecting the touch position in the second direction $D_2$. The plurality of second electrodes 248 are adjacent to each other in the first direction $D_1$, and hence are used for detecting the touch position in the first direction $D_1$.

A pulse voltage output from a pulse generator 262 is applied to the selected one first electrode 246 or one second electrode 248. A first capacitance is a parasitic capacitance formed in one of the electrode groups including the plurality of first electrodes 246 and the plurality of second electrodes 248.

When touching of a conductor, for example, a finger, which serves as a virtual GND, occurs, a capacitance between the first electrode 246 or the second electrode 248 and the reference potential (GND) is increased, and hence the first capacitance is increased. When a pulse voltage is applied to the first electrode 246 or the second electrode 248, an ammeter 264 measures the first physical quantity (current value) corresponding to the first capacitance. The first physical quantity (current value) corresponds to the capacitance between the reference potential and each of the electrode groups including the plurality of first electrodes 246 and the plurality of second electrodes 248.

Figure 12:
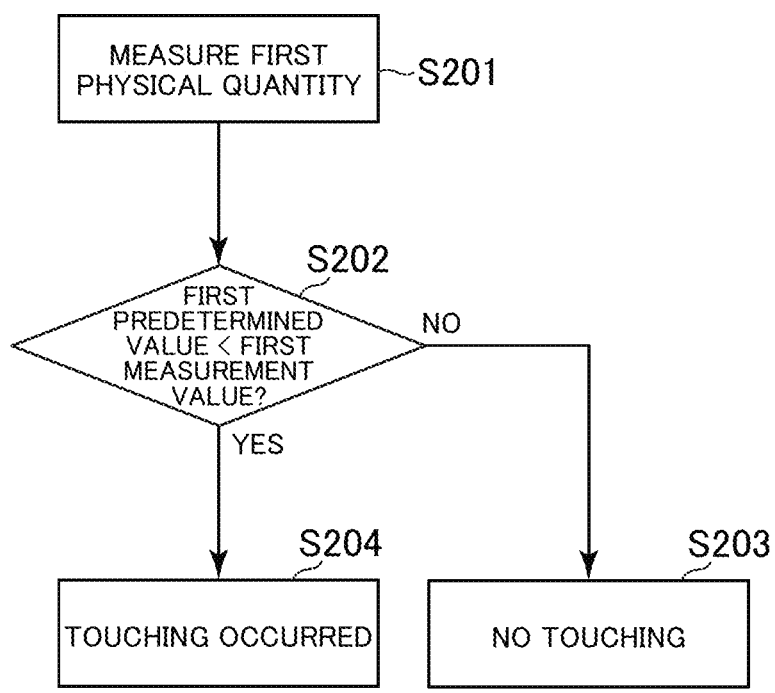
FIG. 12 is a chart for illustrating the flow of the touch sensing of the display device according to the second embodiment.

FIG. 12 is a chart for illustrating the flow of the touch sensing of the display device according to the second embodiment. When the first physical quantity (current value) is measured with the ammeter 264 (S201), the first measurement value obtained through the measurement is input to a determination circuit 266 as illustrated in FIG. 11. The determination circuit 266 determines whether or not the first measurement value is out of the first range. The first range is a range obtained by considering a design value when no touching of a conductor, for example, a finger, occurs, and an error of the design value. No touching is determined when the first measurement value is within the first range. When the first measurement value is out of the first range, it is detected that significant change has occurred in the first capacitance due to approach of a conductor, for example, a finger (that is, touching has occurred).

The second embodiment employs the self-capacitance system in which the first measurement value increases when touching occurs. Therefore, as determination on whether or not the first measurement value is out of the first range, the determination circuit 266 determines whether or not the first measurement value is larger than a first predetermined value (S202). When the result of the determination is NO, it is detected that no touching has occurred (S203). When the result of the determination is YES, it is detected that touching has occurred (S204).

Even the display device of the second embodiment can detect that the screen has been pressed in addition to detection of the touch position. Details thereof correspond to the contents described in the first embodiment. In the second embodiment, the capacitance increases when touching occurs, and the capacitance increases even when pressing occurs. However, the capacitance that increases due to the compression of the insulating elastic layer is significantly larger (about 1,000 times) than the capacitance that increases due to the touching of a finger. Therefore, the first range (first predetermined value) used when whether or not touching has occurred is detected and the second range (second predetermined value) used when whether or not pressing has occurred is detected are significantly different, and hence both the cases can be discriminated and determined.

Third Embodiment

Figure 13:
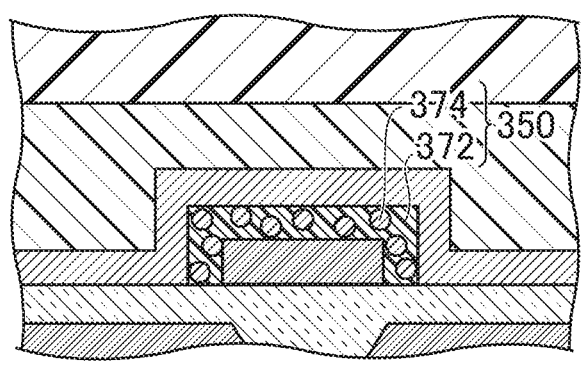
FIG. 13 is a sectional view for illustrating an insulating elastic layer of a display device according to a third embodiment of the present invention.

FIG. 13 is a sectional view for illustrating an insulating elastic layer 350 of a display device according to a third embodiment of the present invention. The insulating elastic layer 350 is formed by dispersing particles 374 in an organic layer 372. The organic layer 372 is made of resins such as an epoxy resin and an acrylic resin. The particles 374 are spread in the resin, and the resin is cured (for example, thermally cured or UV cured) to form a layer. The particles 374 are made of an insulating material having elasticity, and are more flexible than the organic layer 372. The particles 374 are made of an organic material. For example, as the particles 374, a material having less difference (or no difference) in refractive index from the organic layer 372 is preferred to be used, and beads of an acrylic resin or other materials may be used. The organic layer 372 and the particles 374 may be made of the same material.

Fourth Embodiment

Figure 14:
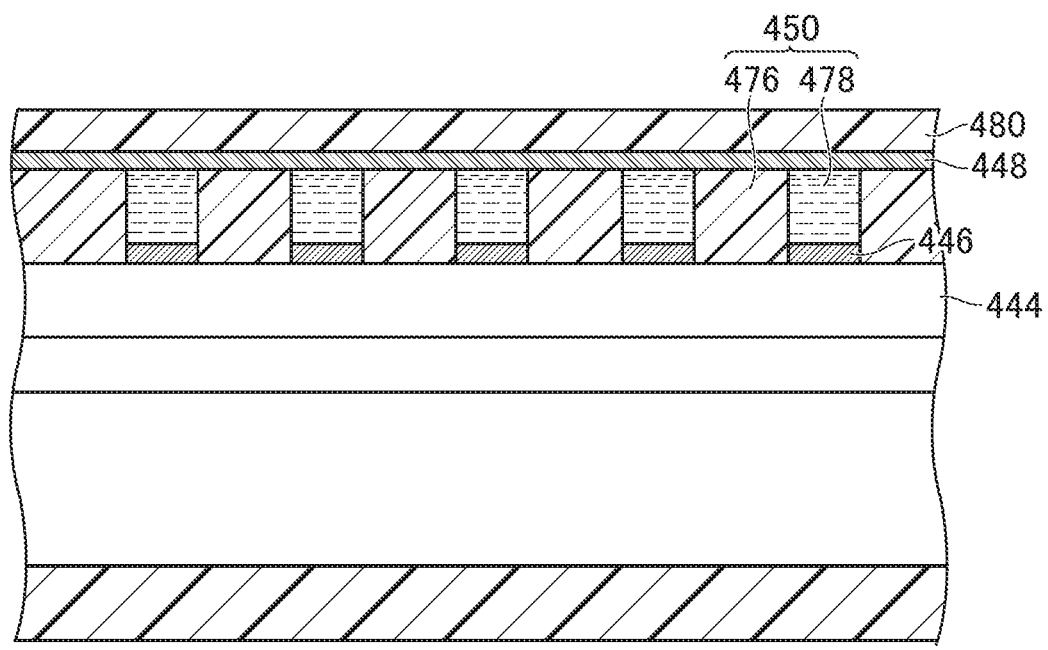
FIG. 14 is a sectional view for illustrating a display device according to a fourth embodiment of the present invention.

FIG. 14 is a sectional view for illustrating a display device according to a fourth embodiment of the present invention. In the fourth embodiment, a plurality of first electrodes 446 are formed on a sealing layer 444. Each of insulating elastic layers 450 includes a solid elastic layer 476. The material of the solid elastic layer 476 corresponds to the material of the insulating elastic layer 50 described above. The solid elastic layers 476 and the plurality of first electrodes 446 do not overlap each other. At least in an image display region, the solid elastic layers 476 may avoid all of the plurality of first electrodes 446. The solid elastic layers 476 are formed to be higher than the plurality of first electrodes 446 from the sealing layer 444. In FIG. 14, the first electrode 446 is formed in contact to the solid elastic layer 476, but the first electrode 446 may be prevented from being formed in contact to the solid elastic layer 476.

The insulating elastic layer 450 includes the solid elastic layer 476 and a fluid elastic layer 478. The fluid elastic layer 478 may be a gas layer of air or the like, or may be a liquid layer of non-volatile liquid or the like. A plurality of second electrodes 448 are bonded to the solid elastic layers 476. The solid elastic layers 476 and the plurality of second electrodes 448 overlap each other. The solid elastic layer 476 serves as a spacer between the first electrode 446 and the second electrode 448. The fluid elastic layers 478 are located at positions at which the fluid elastic layers 478 overlap the plurality of first electrodes 446. The plurality of second electrodes 448 overlap the plurality of first electrodes 446 through intermediation of the fluid elastic layers 478. The fluid elastic layers 478 are located at positions (for example, only at positions) at which the fluid elastic layers 478 and overlapping regions of the plurality of first electrodes 446 and the plurality of second electrodes 448 overlap each other. At least in the image display region, the fluid elastic layers 478 and all of the plurality of first electrodes 446 may overlap each other.

On the opposite side to the insulating elastic layers 450 and the plurality of first electrodes 446, a film 480 made of polyethylene terephthalate or other materials is brought into close contact with the plurality of second electrodes 448 made of indium tin oxide or other materials. This structure can be obtained by bonding the film 480 including the plurality of second electrodes 448 on one surface to the solid elastic layers 476. In order to form the plurality of second electrodes 448 on the insulating elastic layers 450 by sputtering or vapor deposition, an etching mask is required to be formed in a pattern by photolithography, but such a process using a large amount of chemical liquid is unnecessary in the fourth embodiment, and hence the cost can be reduced.

When the film 480 is pressed, the fluid elastic layer 478 is compressed between the first electrode 446 and the second electrode 448. Thus, a capacitance changes, and the pressing can be detected. Details thereof correspond to the contents described above. Following the deformation of the solid elastic layer 476, the fluid elastic layer 478 between the first electrode 446 and the second electrode 448 is easily deformed due to its compression or its fluidity. As a result, the distance between the first electrode 446 and the second electrode 448 can be easily changed, and the sensitivity of pressing can be enhanced.

The display device is not limited to the organic electroluminescent display device, and may be a display device including light emitting elements such as quantum-dot light emitting diodes (QLEDs) in the respective pixels, or may be a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
   a substrate;
   a plurality of pixels on the substrate;
   a light emitting element layer at each of the plurality of pixels and having a structure in which a light emitting layer is sandwiched between a cathode and an anode;
   an inorganic insulating layer on the light emitting element layer;
   a plurality of first electrodes laminated on the inorganic insulating layer, the plurality of first electrodes extending in a first direction and being adjacent to each other in a second direction intersecting with the first direction;
   a plurality of second electrodes laminated on the inorganic insulating layer, the plurality of second electrodes extending in the second direction and being adjacent to each other in the first direction,
   a plurality of elastic layers interposed between the plurality of first electrodes and the plurality of second electrodes in order to secure an interval between the plurality of first electrodes and the plurality of second electrodes, each of the plurality of elastic layers having an island-shape and overlapping with a corresponding one of the first electrodes and a corresponding one of the second electrodes in a plan view; and
   a sensing circuit,
   the sensing circuit being configured to measure a first physical quantity corresponding to a first capacitance being a parasitic capacitance formed in each of electrodes including the plurality of first electrodes and the plurality of second electrodes, to thereby detect that significant change has occurred in the first capacitance due to touching of a conductor when an obtained first measurement value is out of a first range,
   the sensing circuit being further configured to measure a second physical quantity corresponding to a second capacitance formed between each of the plurality of first electrodes and each of the plurality of second electrodes, to thereby detect that significant change has occurred in the second capacitance due to compression of the plurality of elastic layers based on a pressing force when an obtained second measurement value is out of a second range, wherein each of the plurality of pixels is positioned between a corresponding pair of the plurality of elastic layers.

2. The display device according to claim 1, wherein the first physical quantity corresponds to a capacitance between each of the plurality of first electrodes and each of the plurality of second electrodes, and wherein the first measurement value is out of the first range when the first measurement value is smaller than a first predetermined value.

3. The display device according to claim 1, wherein the first physical quantity corresponds to a capacitance between a reference potential and each of the electrodes including the plurality of first electrodes and the plurality of second electrodes, and wherein the first measurement value is out of the first range when the first measurement value is larger than a first predetermined value.

4. The display device according to claim 1, wherein the second measurement value is out of the second range when the second measurement value is larger than a second predetermined value.

5. The display device according to claim 1, wherein the plurality of elastic layers are formed by dispersing particles in an organic layer, and wherein the particles are more flexible than the organic layer.

6. The display device according to claim 5, wherein the organic layer is made of a resin.

7. The display device according to claim 6, wherein the particles are made of an organic material.

8. The display device according to claim 6, wherein the organic layer and the particles are made of the same material.

9. The display device according to claim 1, wherein, in the plan view, the plurality of elastic layers are prevented from being located at least at a part of positions at which the plurality of elastic layers and at least one group of the plurality of first electrodes and the plurality of second electrodes do not overlap each other.

10. The display device according to claim 1, wherein the insulating elastic layers comprise solid elastic layers and fluid elastic layers, respectively, wherein, in the plan view, the solid elastic layers and the plurality of first electrodes are prevented from overlapping each other, and the solid elastic layers and the plurality of second electrodes overlap each other, and wherein, in the plan view, the fluid elastic layers and overlapping regions of the plurality of first electrodes and the plurality of second electrodes overlap each other.

11. The display device according to claim 10, wherein the plurality of second electrodes are fixedly bonded to the solid elastic layers, and wherein the display device further comprises, on an opposite side to the insulating elastic layers and the plurality of first electrodes, a film fixedly bonded to the plurality of second electrodes.

12. The display device according to claim 10, wherein the fluid elastic layer comprises non-volatile liquid.

13. The display device according to claim 1, wherein the plurality of second electrodes have a plurality of first areas overlapping with the plurality of elastic layers and the plurality of first electrodes, the plurality of second electrodes have a second area overlapping with neither the plurality of elastic layers nor the plurality of first electrodes, the plurality of first areas are changeable in height from the substrate, due to the compression of the plurality of elastic layers, and the second area is unchangeable in height from the substrate, despite the pressing force, due to lack of the plurality of elastic layers under the second area.

14. The display device according to claim 1, wherein the elastic layer is made of a dielectric material.

15. The display device according to claim 14, wherein the dielectric material is polyurethane or cellulose acetate.

* * * * *